United States Patent [19]

Hong et al.

[11] Patent Number: 5,089,436
[45] Date of Patent: Feb. 18, 1992

[54] METHOD FOR FABRICATING A SEMICONDUCTOR DEVICE BY SLOPE ETCHING A POLYSILIOW LAYER

[75] Inventors: Jung-In Hong, Suwon; Byung-Deok Yoo, Seoul; Tae-Hyuk Ahn, Taegu, all of Rep. of Korea

[73] Assignee: Samsung Semiconductor and Telecommunications Co., Ltd., Suwon, Rep. of Korea

[21] Appl. No.: 519,261

[22] Filed: May 2, 1990

Related U.S. Application Data

[63] Continuation-in-part of Ser. No. 241,972, Sep. 8, 1988, abandoned.

[30] Foreign Application Priority Data

Sep. 21, 1987 [KR] Rep. of Korea ............ 87-10445

[51] Int. Cl.$^5$ ............................................. H01L 21/70
[52] U.S. Cl. ............................................. 437/60; 437/46; 437/47; 437/48; 437/52; 437/228; 437/233; 437/919
[58] Field of Search .................. 437/28, 46, 47, 52, 437/60, 164, 191, 193, 235, 233, 919, 981, 228; 357/23.6, 51

[56] References Cited

U.S. PATENT DOCUMENTS

| | | | |
|---|---|---|---|
| 3,756,861 | 9/1973 | Payne et al. | 437/28 |
| 3,936,331 | 2/1976 | Lue et al. | 437/233 |
| 3,980,507 | 9/1976 | Carley | 437/233 |
| 4,057,895 | 11/1977 | Ghezzo | 437/46 |
| 4,240,196 | 12/1980 | Jacobs et al. | 437/233 |
| 4,349,408 | 9/1982 | Tarng et al. | 437/233 |
| 4,350,536 | 9/1982 | Nakano et al. | 437/47 |
| 4,364,779 | 12/1982 | Kamgar | 437/45 |
| 4,370,798 | 2/1983 | Lien et al. | 437/46 |
| 4,503,601 | 3/1985 | Chiao | 437/46 |
| 4,609,429 | 9/1986 | Ishaq et al. | 437/28 |
| 4,702,000 | 10/1987 | Matlock et al. | 437/233 |

FOREIGN PATENT DOCUMENTS

| | | | |
|---|---|---|---|
| 0049553 | 5/1981 | Japan | 437/52 |
| 0049554 | 5/1981 | Japan | 437/52 |
| 0072331 | 5/1982 | Japan | 437/233 |
| 0193062 | 11/1982 | Japan | 437/233 |
| 0264740 | 11/1986 | Japan | 437/233 |
| 0264741 | 11/1986 | Japan | 437/233 |

OTHER PUBLICATIONS

Coburn, "Plasma Assisted Etching", Plasma Chemistry and Plasma Processing, vol. 2, No. 1, 1982, pp. 1–41.
Rideout, "Double Polysilicon Dynamic Random-Access Memory Cell with Increased Change Storage Capacitance", IBM TDB, vol. 21, No. 9, Feb. 1979.
Yhomdhi, "VLSI Fabrication Principles", John Wiley & Sons, 1983, pp. 353-34.

Primary Examiner—Brian E. Hearn
Assistant Examiner—Tom Thomas
Attorney, Agent, or Firm—Ladas & Parry

[57] ABSTRACT

This invention provides a method for manufacturing a semiconductor device which prevents residues from remaining around an etching pattern of a poly-silicon by making the poly-silicon be gradiently etched out. An oxide barrier layer is deposited over a poly-silicon layer, and impurities are implanted through the oxide barrier layer, wherein the concentration difference of impurities makes the poly-silicon have a graded sidewalls, and the value of resistance is controlled by the quantity of impurities. After removing the oxide barrier layer the poly-silicon is selectively etched into a poly electrode having a graded sidewall. The thermal treatment of the poly electrode is carried out and a polysilicon for another electrode is deposited and etched out.

2 Claims, 4 Drawing Sheets

METHOD FOR FABRICATING A SEMICONDUCTOR DEVICE BY SLOPE ETCHING A POLYSILIOW LAYER

This is a continuation-in-part of copending application Ser. No. 07/241,972 filed on Sept. 8, 1988 now abandoned.

BACKGROUND OF THE INVENTION

This invention relates to a method for fabricating a semiconductor device, and more specifically to a method for removing a poly-silicon residues around the etching pattern by graded etching of poly-silicon which acts as the electrode of the capacitor for a MOS-DRAM.

The fabricating method of the conventional MOS-DRAM is shown in FIG. 2 and will be explained below. First, a field oxide layer 2 and a capacitor dielectric (oxide) layer 3 are grown on a p-type single crystalline-silicon substrate 1 and then a poly silicon layer 4 for a first electrode is deposited as shown in FIG. 2(a). By plasma etching or RIE(Reactive Ion Etching), a restricted portion of said poly-silicon 4 is etched out as shown in FIG. 2(b), and then an oxide layer 6 is grown on the remaining portions of the poly-silicon 4 as shown in FIG. 2(c). A poly silicon layer 5 for a second electrode, which is used as a gate electrode of a MOS transistor, is deposited on the entire surface of the silicon substrate 1.

After etching restricted portions of said poly-silicon layer 5, the fabrication of MOS-DRAM is completed.

However, several problems to be solved remain in a conventional DRAM fabricating method. Since a restricted portion of the poly-silicon 4 for the first electrode of the capacitor is etched out by means of the plasma etching or RIE, using the etching pattern 11 of the poly-silicon layer for the first electrode as shown in FIG. 1, and hence the edges of the remaining part of the poly-silicon 4 have a right-angled section as shown in FIG. 2. For the isolation of the first poly electrode and the second poly electrode 5, the oxide layer 6 is grown on the poly-silicon layer 4. But the thickness of the grown oxide layer is not uniform and a recess 8 is formed on the bottom of the pattern edge as shown in FIG. 2(c).

The recess 8 is formed by the growth rate difference of the oxide layers on the surfaces between the silicon substrate 1 and the poly-silicon 4, because in the poly-silicon 4, the dopant is diffused in order to lower its resistance. The poly-silicon layer 5 for the second electrode is deposited on the entire surface of the silicon substrate 1 and by RIE method, the poly-silicon 5 is etched into the second electrodes 5' which will form the gates of the transistor. During this process, the residues 9 of the poly-silicon for the second electrode are remained in said recess 8. Since such the poly-silicon residues 9 are left in the recess around the first poly etching pattern 11 shown in FIG. 1, the second electrodes, which act as the gates of transistors, are shorted one another. Therefore, in order to prevent the poly-silicon from shorting, another pattern 12 in FIG. 1 for the removal of the residues is formed and another process step for the removal of the poly residues is necessary.

SUMMARY OF THE INVENTION

It is therefore, a principal object of this invention to provide a method of fabricating a semiconductor device which avoids poly-silicon residue around an etching pattern in oxide layered poly-silicon layer for a first electrode, on an oxide layer for process simplification and cost reduction.

In accordance with the present invention, there is provided a method for fabricating a semiconductor device which removes the poly-silicon residues around the etching pattern for the first poly electrode and making it easy to open the active area, comprising the steps of:

a) an oxide barrier layer is grown on a poly-silicon for the first electrode and dopant is doped, b) the poly-silicon for the first electrode is etched into graded sidewall after removing the oxide barrier layer, c) oxide layers of difference thickness are grown on a capacitor region and a transistor region after the thermal treatment of the poly-silicon, and d) a poly-silicon for the second electrode is deposited on the oxide layer and etched out.

DETAILED DESCRIPTION OF SPECIFIC EMBODIMENT

Figure 3A:
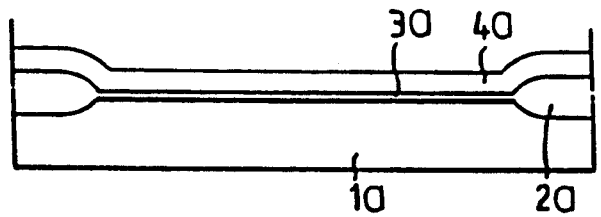
FIGS. 3a to 3f are schematic elevations of process steps for the fabrication of a MOS DRAM according to the invention.
Figure 3B:
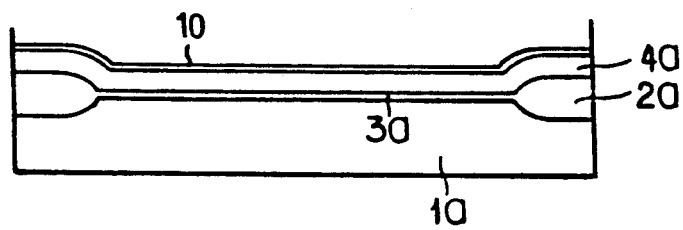
Figure 3C:
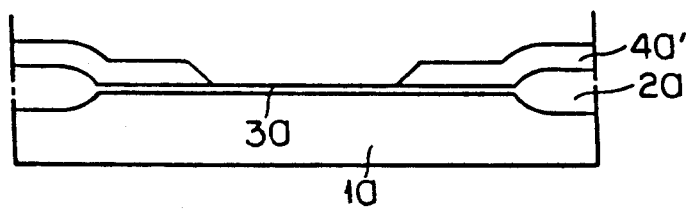

In an embodiment of this invention, as shown in FIG. 3a, regions of a field oxide layer 2a (for the isolation of devices) are grown on a p-type silicon substrate 1a, and a dielectric (oxide) layer 3a (for capacitor) is grown between the regions of the former. After that, a poly-silicon layer 4a (for a first electrode) is deposited all over the preceding, as also shown in FIG. 3a. Then, an oxide barrier layer 10 of about 500Å thickness is grown all over the layer 4a and impurity ions are implanted in order to control the resistance of the poly-silicon layer 4a (for the first electrode), the former being shown in FIG. 3(b). After the removal of the oxide barrier layer 10, a restricted portion of the poly-silicon layer 4a for the first electrode is etched using a photoresist mask. In this process step, the etched poly-silicon 4a has a graded sidewall due to the impact damage distribution according to the concentration distribution after ion implantation as shown in FIG. 3(c).

That is, as generally known, ion implantation causes damage to the lattice structure of a material through which the ions are implanted; the degree of damage at any point in the material being a function of the concentration or density of the ions reaching or passing that point. Thus, the degree of damage is always maximum at the top surface of a layer of material into which the ions are implanted and decreases towards the bottom surface thereof. Also, the greater is the damage to the material, the faster is the etching of the material in the vertical direction. This results in a variable vertical direction etching rate of the material and allows the formation of a graded side wall of an opening etched through the material.

Figure 1:
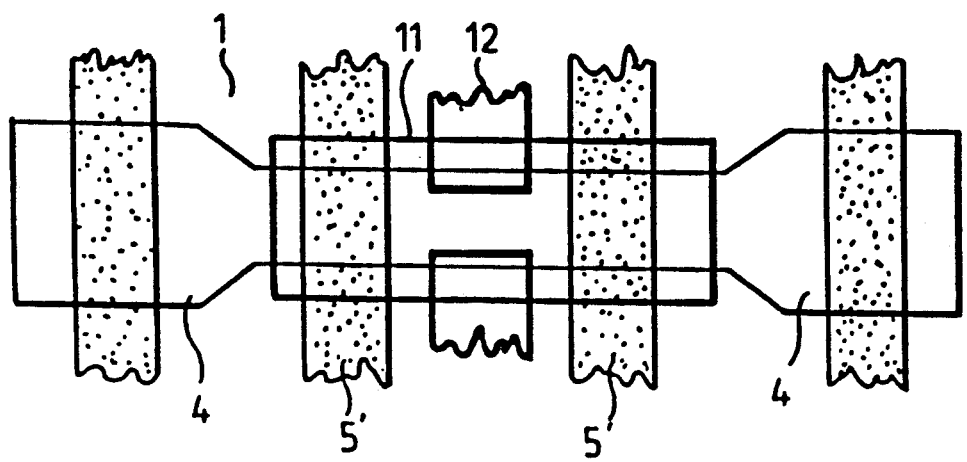
FIG. 1 is a schematic plan view of a portion of a conventional MOS DRAM, together with etching patterns for fabricating the same.
Figure 4A:
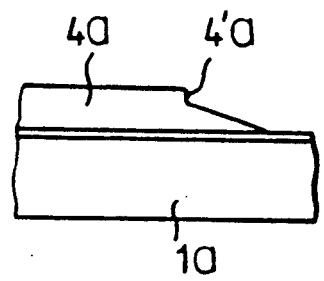
FIGS. 4a 4b are enlarged schematic elevations of graded etched portions according to the invention.
Figure 4B:
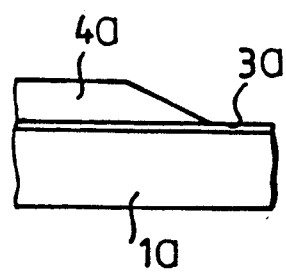
Figure 2A:
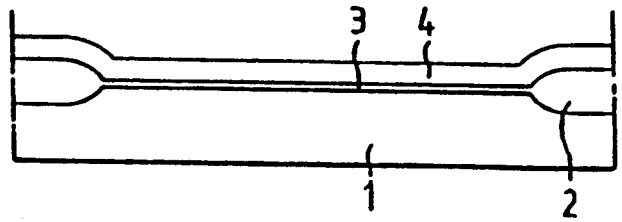
FIG. 2a to 2e are schematic elections of conventional process steps for the fabrication of the conventional MOS DRAM of FIG. 1.
Figure 2B:
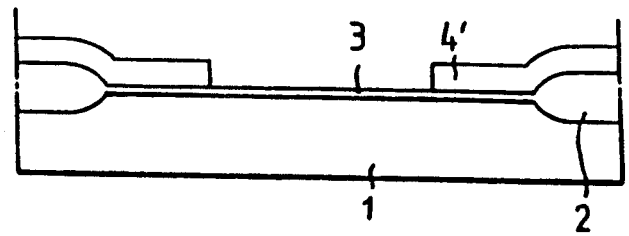
Figure 2C:
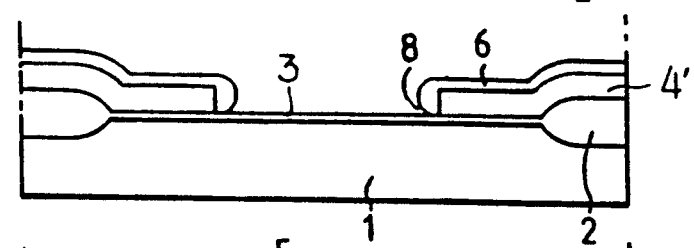
Figure 2D:
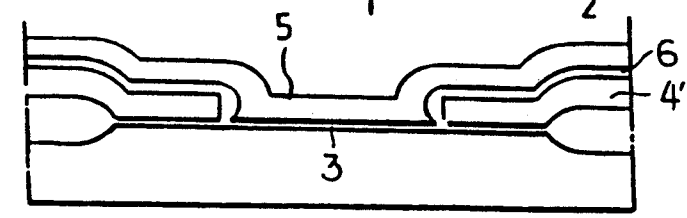
Figure 2E:
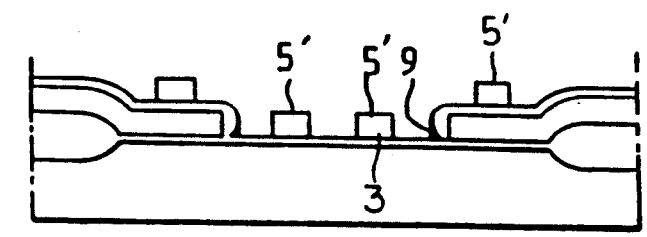

In particular, during the above dry etching step, the etching is performed directly under the gas state comprising Cl-base without the heat treatment of the implanted dopants so that the angle of graded sidewalls can be controlled easily and effectively. The enlarged view on the graded sidewall part is shown in FIG. 4(b). Although the etching can be performed after the ion implantation of impurities without the growth of the oxide barrier layer 10 on the poly-silicon layer 4, in this case, a step 4' is formed on the upper part of the slope as shown in FIG. 4(a) so that the relatively thin capacitor dielectric layer 6 can grow on this step and the isolation between the first and second poly electrodes 4, 5 can be unstable.

The cause of the step 4' is as follows: AS previously described, a graded side wall is obtainable owing to a variable etch rate through the material resulting from a vertical variation of the damage through the layer being etched. In the situation, however, where the maximum density of ions within the layer occurs at some depth within the layer, all portions of the layer above that point will have suffered more or less the same damage caused by the ions passing therethrough, and a vertical variation of damage is not present in these upper portions. Thus, etching through these layer upper portions does not produce the desired graded side wall, but a vertical wall. The height of this vertical wall, comprising the undesired step 4', is a function of the acceleration energy of the ions.

Figure 5A:
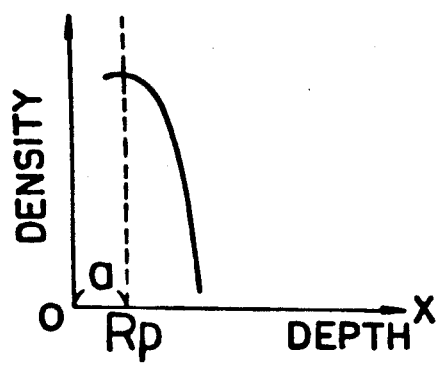
FIGS. 5a and 6a are graphs showing the density of ions implanted into a layer verses the depth of the ions.
Figure 5B:
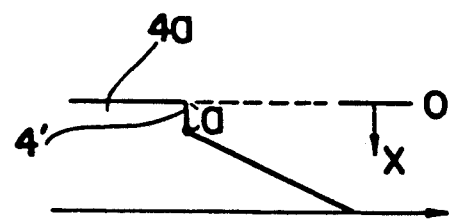
FIGS. 5b and 6b are enlarged schematic elevations of graded etched portions resulting from the etching of poly-silicon layers ion implanted according to the graphs of FIGS. 5a and 5b, respectively.
Figure 6A:
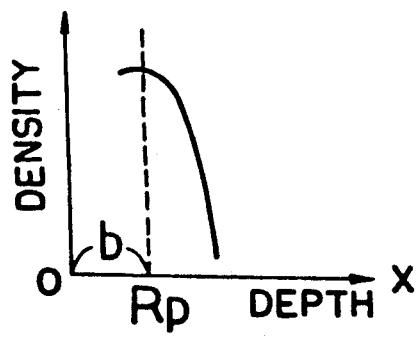

This is illustrated in FIGS. 5a, 5b, 6a and 6b. FIGS. 5a and 6a are graphs plotting ion density or concentration along the vertical axes of the graphs against depth of penetration of the ions into the layer 4a (without a covering layer 10) along the horizontal axes of the graphs. The ion density profile shown in FIG. 6a results from using an ion acceleration energy about twice that used in FIG. 5a. The result of this is that the depth (b) of the point of maximum ion density (Rp) shown in FIG. 6a is about twice that of the depth (a) shown in FIG. 5a.

Figure 6B:
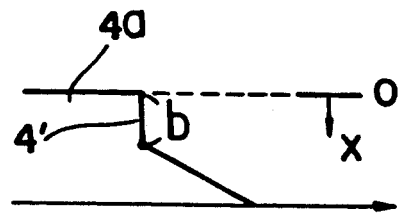

FIGS. 5b and 6b show the results of etching a hole through layers 4a having the ion density profiles shown in FIGS. 5a and 6a, respectively. As shown, the height of the step 4' formed in each layer is about equal to the corresponding depth (a) or (b) of the depth of the ion density maximum (Rp). This occurs because, until the depth (a) or (b) is reached, there is little variation in the extent of damage caused by the ions and little possibility of obtaining the variable vertical etch rate necessary to obtain the desired graded side wall. Thus, the undesired steps 4' result.

It is possible to reduce the height of the vertical step 4' by greatly reducing the ion implantation energy. This is not practical, however, because, with a suitably low acceleration energy, only a surface doping occurs and the desired level of electrical conductivity of the layer 4a cannot be obtained. Also, in the absence of a significant doping variation through the thickness of the layer 4a, the desired degree of slope of the side walls can not be obtained.

By providing, in accordance with this invention, a barrier layer 10 through which the ion implantation is made, it is possible to cause the maximum density, Rp, of the ions to be located above the upper surface of the layer 4a, i.e., within the barrier layer 10. In such case, the density of ions decreases continuously from the upper surface of the layer 4a towards the lower surface thereof, and the step 4' can be avoided.

Since the impact distribution ion maximum density, Rp, is located more deeply in the first poly-silicon 4 implanted layers proportionally to the magnitude of the ion energy of impurities to be implanted into the oxide barrier layer 10 poly-silicon layer 4, the oxide barrier layer 10 should have an enough sufficient thickness to ensure that the maximum ion density occurs within the barrier layer 10. Published data exists specifying, for dopants, e.g., antimony, arsenic, boron, phosphorous, etc. the depth, Rp, of the maximum ion density for different acceleration energies of the implanted ions into layers of different materials, e.g., $SiO_2$, $Si_3N_4$, etc.

For example, for phosphorous of 40 KeV implantation energy, about 500 Å thickness is adequate for the oxide barrier layer.

This is based upon published data which shows that the depth of maximum ion density, Rp, of phosphorous, implanted at an energy of 40 KeV into $SiO_2$, is 388 Å, with a projected standard deviation of 152 Å. Similarly, using a barrier layer 10 of $Si_3N_4$ and phosphorous ions at an implantation energy of 40 KeV, the required thickness of the barrier layer 10, to ensure that the maximum ion density, Rp, occurs above the layer 4a, and within the barrier layer 10, is around 400 Å. Selection of other barrier layer materials and thicknesses, to achieve the desired results, with various different dopants and implantation energies, is within the skill of workers in this art.

Figure 3D:
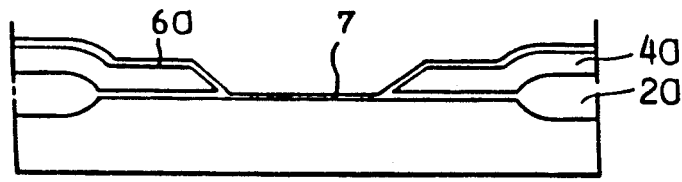
Figure 3E:
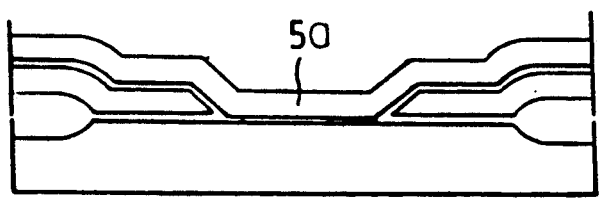
Figure 3F:
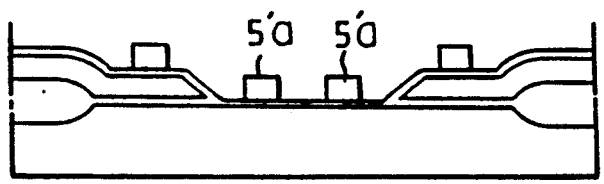

In order to redistribute the implanted impurities for lowering resistance, a heat treatment is performed for 30 minutes in $N_2$ ambient at 950° C. Then, a thick oxide layer 6a is grown for the isolation between the capacitor and the second poly electrode and a thin oxide layer 7 is grown on a MOS active region so that an openning can be easily obtained as shown in FIG. 3(d). The ideal thickness ratio of the oxide layers 6, 7 is from 4:1 to 5:1. After the deposition of a poly-silicon layer 5 for the second electrode which will form the gate of a transistor as shown in FIG. 3(e), the photolithographic etching process for gate electrodes 5a' completes the whole MOS DRAM fabricating process. In this case, no residues of the poly-silicon 5a remain around the etching pattern of the poly-silicon layer 5a for the second electrode, so no other process step for the removal of the residues is necessary.

Accordingly, in the process according to the invention, there is not necessary the removal process step of poly-silicon residues since the residues of the poly-silicon for the second electrode are not remained owing to the graded sidewall of the poly-silicon layer for the first electrode. In addition, the ion implantation for the graded side wall etching can be used for the control of the resistance of the poly-silicon, so no other diffusion process is necessary. Therefore, the simplification and cost reduction of the fabricating process is obtained.

What is claimed is:

1. A method of fabricating a semiconductor device, comprising the steps of:
   (a) growing a barrier layer over a surface of a poly-silicon layer;
   (b) implanting ions in said poly-silicon layer through said barrier layer;
   (c) removing said barrier layer;
   (d) slope etching said poly-silicon layer using a photoresist mask; and,
   in the step (a) of growing the barrier layer, growing said barrier layer to a thickness sufficient to cause the point of maximum density of the ions implanted in step (b) to be located within said barrier layer.

2. A method according to claim 1 wherein said barrier layer comprises silicon dioxide and has a thickness of substantially 500 Å when the ion impurity is phosphorus and the implantation energy is 40 KeV.

UNITED STATES PATENT AND TRADEMARK OFFICE
CERTIFICATE OF CORRECTION

PATENT NO. : 5,089,436
DATED : Feb. 18, 1992
INVENTOR(S) : Jung-In Hong, Byung-Deok Yoo, Tae-Hyuk Ahn It is certified that error appears in the above-identified patent and that said Letters Patent is hereby corrected as shown below:

Title Page, Column 1, Item [54]

Change "Polysiliow" to ---Polysilicon---

Signed and Sealed this

Fifteenth Day of June, 1993

Attest:

MICHAEL K. KIRK

Attesting Officer     Acting Commissioner of Patents and Trademarks